United States Patent
Qu

(10) Patent No.: US 10,459,563 B2
(45) Date of Patent: Oct. 29, 2019

(54) IN-CELL TOUCH DISPLAY SCREEN AND DISPLAY DEVICE

(71) Applicants: BOE Technology Group Co., Ltd., Beijing (CN); Beijing BOE Optoelectronics Technology Co., Ltd., Beijing (CN)

(72) Inventor: Lianjie Qu, Beijing (CN)

(73) Assignees: BOE Technology Group Co., Ltd., Beijing (CN); Beijing BOE Optoelectronics Technology Co., Ltd., Beijing (CN)

( * ) Notice: Subject to any disclaimer, the term of this patent is extended or adjusted under 35 U.S.C. 154(b) by 0 days.

(21) Appl. No.: 14/892,312

(22) PCT Filed: May 15, 2015

(86) PCT No.: PCT/CN2015/079121
§ 371 (c)(1),
(2) Date: Nov. 19, 2015

(87) PCT Pub. No.: WO2016/101511
PCT Pub. Date: Jun. 30, 2016

(65) Prior Publication Data
US 2016/0357309 A1    Dec. 8, 2016

(30) Foreign Application Priority Data
Dec. 24, 2014  (CN) .......................... 2014 1 0818510

(51) Int. Cl.
*G06F 3/041*    (2006.01)
*G06F 3/044*    (2006.01)
(Continued)

(52) U.S. Cl.
CPC ........ *G06F 3/0416* (2013.01); *G02F 1/13338* (2013.01); *G06F 3/044* (2013.01);
(Continued)

(58) Field of Classification Search
CPC ......... G06F 3/041; G06F 3/045; G01R 27/26; G02F 1/1343; H01L 27/32
See application file for complete search history.

(56) References Cited

U.S. PATENT DOCUMENTS

2005/0068310 A1*  3/2005  Ishii .................... G09G 3/3688
                                                    345/204
2011/0227851 A1*  9/2011  Oh ...................... G02F 1/13338
                                                    345/173
(Continued)

FOREIGN PATENT DOCUMENTS

CN    102955303 A    3/2013
CN    202854765 U    4/2013
(Continued)

OTHER PUBLICATIONS

Sep. 11, 2015—(WO) International Search Report and Written Opinion Appn PCT/CN2015/079121 with English Tran.
(Continued)

*Primary Examiner* — Pegeman Karimi
(74) *Attorney, Agent, or Firm* — Banner & Witcoff, Ltd.

(57) ABSTRACT

An in-cell touch display screen and a display device are provided. The in-cell touch display screen comprises an upper substrate and a lower substrate that are cell-assembled, and a plurality of first touch electrodes and a plurality of second touch electrodes that are disposed on the upper substrate and/or the lower substrate without contacting each other; the display screen comprises an image display area, a static-electricity shield layer is disposed on a light emitting side of the upper substrate, and the static-electricity shield layer comprises a plurality of hollowed-out areas corresponding to the image display area. The in-cell touch display screen can resolve a problem that the static-
(Continued)

electricity shield layer of a common in-cell touch display screen may shield touch signals.

14 Claims, 5 Drawing Sheets

(51) Int. Cl.
| | |
|---|---|
| *G02F 1/1333* | (2006.01) |
| *G02F 1/1335* | (2006.01) |
| *G02F 1/1343* | (2006.01) |
| *H01L 27/32* | (2006.01) |
| *G02F 1/1362* | (2006.01) |

(52) U.S. Cl.
CPC ...... *G06F 3/0412* (2013.01); *G02F 1/133514* (2013.01); *G02F 1/134309* (2013.01); *G02F 1/136204* (2013.01); *G06F 2203/04107* (2013.01); *H01L 27/323* (2013.01)

(56) References Cited

U.S. PATENT DOCUMENTS

| | | |
|---|---|---|
| 2011/0285640 A1 | 11/2011 | Park et al. |
| 2012/0120011 A1 | 5/2012 | Teng et al. |
| 2013/0293491 A1* | 11/2013 | Doi .................. G06F 3/044 345/173 |
| 2014/0333853 A1 | 11/2014 | Kitajima et al. |
| 2014/0362049 A1 | 12/2014 | Inoue |
| 2015/0145808 A1* | 5/2015 | Cho .................. G06F 3/0412 345/174 |
| 2015/0270323 A1* | 9/2015 | Cho .................. H01L 27/3272 257/40 |
| 2016/0103518 A1* | 4/2016 | Yang .................. G06F 3/0412 345/173 |

FOREIGN PATENT DOCUMENTS

| | | |
|---|---|---|
| CN | 202854766 U | 4/2013 |
| CN | 104049798 A | 9/2014 |
| CN | 104461155 A | 3/2015 |
| CN | 204270271 U | 4/2015 |

OTHER PUBLICATIONS

Dec. 21, 2016—(CN) First Office Action Appn 201410818510.X with English Tran.
Apr. 26, 2017—(CN) Second Office Action Appn 201410818510.X with English Tran.
Sep. 12, 2017—(CN) Third Office Action Appn 201410818510.X with English Tran.

* cited by examiner

IN-CELL TOUCH DISPLAY SCREEN AND DISPLAY DEVICE

The application is a U.S. National Phase Entry of International Application No. PCT/CN2015/079121 filed on May 15, 2015, designating the United States of America and claiming priority to Chinese Patent Application No. 201410818510.X filed on Dec. 24, 2014. The present application claims priority to and the benefit of the above-identified applications and the above-identified applications are incorporated by reference herein in their entirety.

TECHNICAL FIELD

Embodiments of the present invention relates to an in-cell touch display screen and a display device.

BACKGROUND

A touch screen is also known as a "touch-control screen" and is the simplest, convenient and natural means of human-machine interaction. It is a brand-new multi-media interaction device with extreme attractions and also accords multi-media a new experience. An in-cell touch screen comprises touch electrodes provided within a display screen. Because an in-cell touch screen is lighter and slimmer, it is more and more widely applied in the field of display.

Taking an in-cell touch liquid crystal display screen as an example, the liquid crystal display screen includes an array substrate, a color filter substrate, and liquid crystal between the array substrate and the color filter substrate. Before the array substrate and the color filter substrate are assembled together, a touch driving electrode (Tx) and a touch sensing electrode (Rx) are formed on the array substrate or the color filter substrate. Then, after the array substrate and the color filter substrate are assembled together, the touch driving electrode and the touch sensing electrode are disposed within the liquid crystal cell formed by the assembly of the array substrate and the color filter substrate.

In the in-cell touch liquid crystal display screen, a conductive layer is typically disposed on an outer surface of the color filter assembled with the array substrate, so as to prevent external static-electricity. The conductive layer is generally formed with good conductivity, so that the conductive layer can shield external electromagnetic waves or static-electricity. The better the conductivity is, the more touch signals are shielded, but in a serious situation where a touch function is disabled.

SUMMARY

Embodiments of the invention provide an in-cell touch display screen and a display device. The in-cell touch display screen prevents interference of external electromagnetic waves and static-electricity, while does not shields touch signals.

An embodiment of the invention provides an in-cell touch display screen, comprising an upper substrate and a lower substrate that are cell-assembled, and a plurality of first touch electrodes and a plurality of second touch electrodes that are disposed on the upper substrate and/or the lower substrate without contacting each other, the display screen comprises an image display area; a static-electricity shield layer is disposed on a light emitting side of the upper substrate, the static-electricity shield layer comprises a plurality of hollowed-out areas corresponding to the image display area.

An embodiment of the invention provides a display device, comprising any of the in-cell touch display screens provided by an embodiment of the invention.

BRIEF DESCRIPTION OF THE DRAWINGS

In order to clearly illustrate the technical solution of embodiments of the invention, the drawings of the embodiments will be briefly described in the following; it is obvious that the described drawings are only related to some embodiments of the invention. Those skilled in the art may further acquire other figures based on these drawings without any inventive work.

FIG. 7 is an orthographic projection view of the static-electricity shield layer, a first touch electrode and a second touch electrode illustrated in FIG. 6a.

REFERENCE NUMBER

1—display area; 2—frame area; 10—upper substrate; 11—first touch electrode; 12—static-electricity shield layer; 15—first connecting line; 16—second connecting line; 20—lower substrate; 21—second touch electrode; 30—liquid crystal; 120—hollowed-out areas; 121—first conductive strip; 122—second conductive strip.

DETAILED DESCRIPTION

Technical solutions of the embodiments will be described in a clearly and fully understandable way in connection with the drawings related to the embodiments of the invention. Apparently, the described embodiments are just a part but not all of the embodiments of the invention. Based on the described embodiments herein, those skilled in the art can obtain other embodiment(s), without any inventive work, which should be within the scope of the invention.

Figure 1:
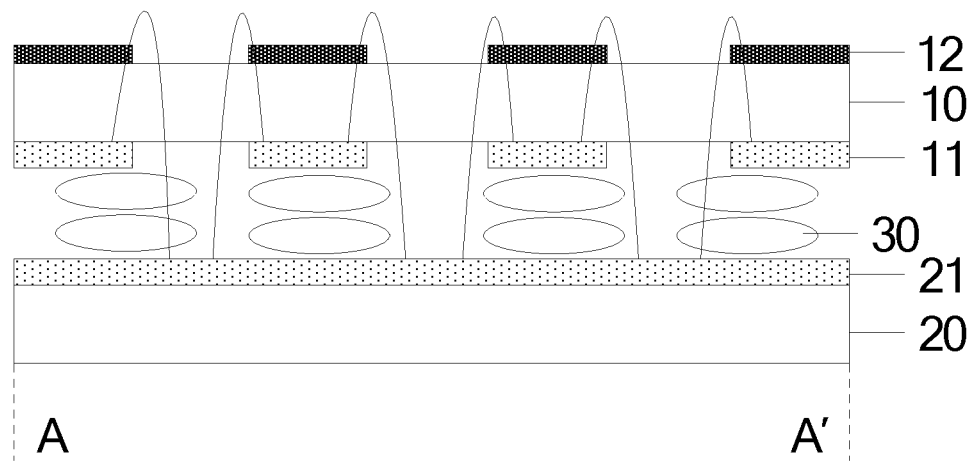
FIG. 1 is a schematic view of an in-cell touch display screen provided by an embodiment of the invention.
Figure 2:
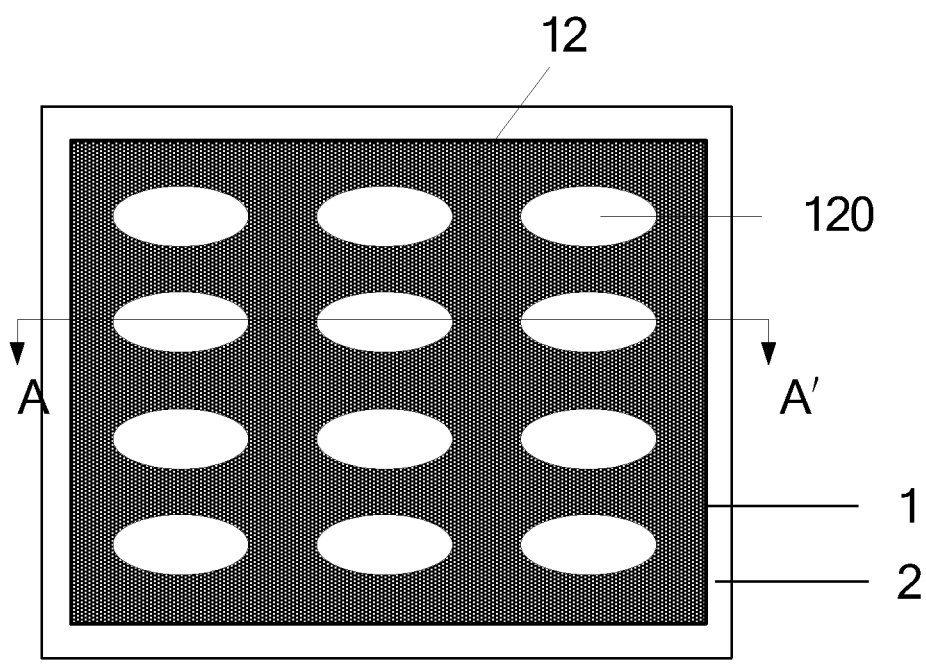
FIG. 2 is a schematic view of a static-electricity shield layer of the in-cell touch display screen illustrated in FIG. 1.

As shown in FIG. 1, an embodiment of the invention provides an in-cell touch display screen, comprising an upper substrate 10 and a lower substrate 20 that are cell-assembled together, and a plurality of first touch electrodes 11 and a plurality of second touch electrodes 21 disposed on the upper substrate 10 and/or the lower substrate 20 without contacting each other. The first touch electrodes 11 and the second touch electrodes 21 intercross, and the display screen comprises an image display area 1 and a frame area 2. The frame area 2 is adjacent to the image display area 1 and surrounds the image display area 1. As shown in FIG. 2, the area within an inner side rectangular frame is a display area, and the area between the inner side rectangular frame and an outer side rectangular frame is the frame area.

A static-electricity shield layer 12 is disposed on a light emitting side of the upper substrate 10, as shown in FIG. 2. The static-electricity shield layer 12 includes a plurality of hollowed-out areas 120 corresponding to the image display area 1. The hollowed-out areas 120 are areas where the substrate is not covered by the static-electricity shield layer. Of course, the areas where the substrate is not covered by the static-electricity shield layer may be in any other shape, which is not specifically limited by embodiments of the invention.

For example, the hollowed-out areas may be formed by a patterning process. For example, the patterning process may include a photolithography process only, or include a photolithography process and an etching process, and also may further include other processes for forming a predetermined pattern, such as printing, ink jetting, or the like. The photolithography process is a process including procedures such as masking, exposing, developing or the like to form a pattern by means of photoresist, mask, exposing machine or the like. The patterning process may be selected according to the structure to be formed in the embodiment of the invention.

It should be noted that the first touch electrodes and the second touch electrodes may be touch driving electrodes and touch sensing electrodes, respectively. In an embodiment of the invention, description will be conducted with the first touch electrodes being touch driving electrodes and the second touch electrodes being touch sensing electrodes. For example, the first touch electrodes are disposed above the second touch electrodes. The first touch electrodes are disposed on an upper substrate, and the second touch electrodes are disposed on a lower substrate.

The in-cell touch display screen includes a plurality of first touch electrodes and a plurality of second touch electrodes, which are disposed on the upper substrate and/or the lower substrate without contacting each other. For example, the plurality of first touch electrodes and the plurality of second touch electrodes are both disposed on the upper substrate, or the plurality of first touch electrodes and the plurality of second touch electrodes are both disposed on the lower substrate. Or, the plurality of first touch electrodes and the plurality of second touch electrodes are disposed on the upper substrate and the lower substrate, respectively. That is, there are two cases in which the plurality of first touch electrodes are disposed on the upper substrate and the plurality of second touch electrodes are disposed on the lower substrate, or the plurality of second touch electrodes are disposed on the upper substrate and the plurality of first touch electrodes are disposed on the lower substrate.

It should be noted that the terms "upper" and "lower" in the embodiment are defined with respect to the light propagating direction. That is, the light emitting side is referred to as "upper", and the light entering side is referred to as "lower". The embodiments and drawings of the invention all take a liquid crystal display screen as an example of a display screen. As shown in FIG. 1, the upper substrate 10 is a color filter substrate, and the lower substrate 20 is an array substrate. The display screen further includes liquid crystal 30 disposed between the upper substrate 10 and the lower substrate 20. Light emitted from a back light source passes through the array substrate and then pass through the liquid crystal and the color filter in sequence.

An embodiment of the invention provides an in-cell touch display screen. A static-electricity shield layer is disposed on a light emitting side of the display screen. The static-electricity shield layer includes a plurality of hollowed-out areas corresponding to the image display area, so as to avoid the static-electricity shield layer from shielding touch sensing signals of the first touch electrodes and the second touch electrodes. On one hand, the static-electricity shield layer ensures sensitivity of touch sensing to avoid malfunction of touching. On the other hand, the static-electricity shield layer can be connected to the ground or other conductive lines, so as to prevent interference of external static-electricity, electromagnetic waves or the like.

It should be noted that the static-electricity shield layer of the embodiments of the invention may be formed of, for example, a transparent conductive material capable of leading out static-electricity. The transparent conductive material, for example, includes carbon nanotubes, graphene, transparent metal, transparent metal oxide, or the like. The transparent metal, for example, includes silver nanowires. The transparent metal oxide, for example, includes tin indium oxide. As long as the transparent conductive material is capable of leading out static-electricity, the material is not specifically limited in the invention.

Figure 3A:
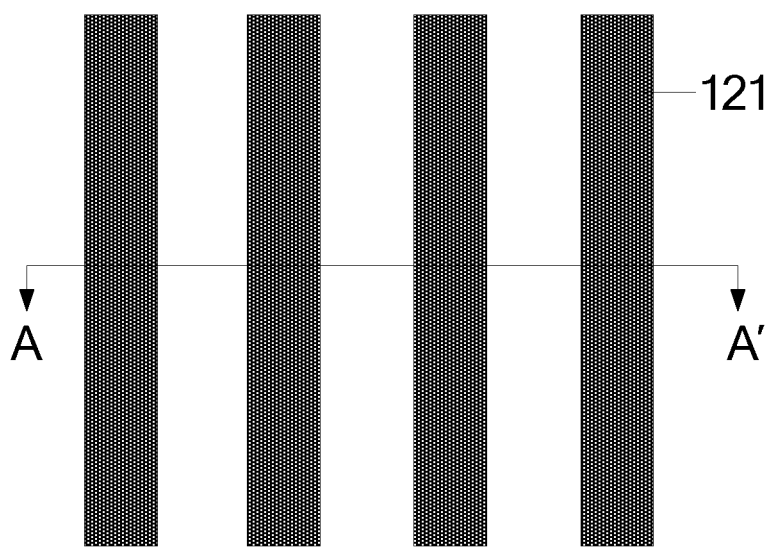
FIG. 3a is a schematic view of another static-electricity shield layer of the in-cell touch display screen illustrated in FIG. 1.

For example, as shown in FIG. 3a, the static-electricity shield layer 12 includes a plurality of first conductive strips 121 electrically connected. Positions of the first conductive strips 121 correspond to positions of the first touch electrodes 11. Because a touch signal is generated between the touch electrodes, it is helpful for the first touch electrodes and the second electrodes to sense the touch signal in the hollowed-out area with the positions of the first conductive strips corresponding to the positions of the first touch electrodes and the hollowed-out areas are between the first conductive strips. The hollowed-out areas are the areas apart from the first conductive strips of the static-electricity shield layer and corresponding to the image display area.

Figure 3B:
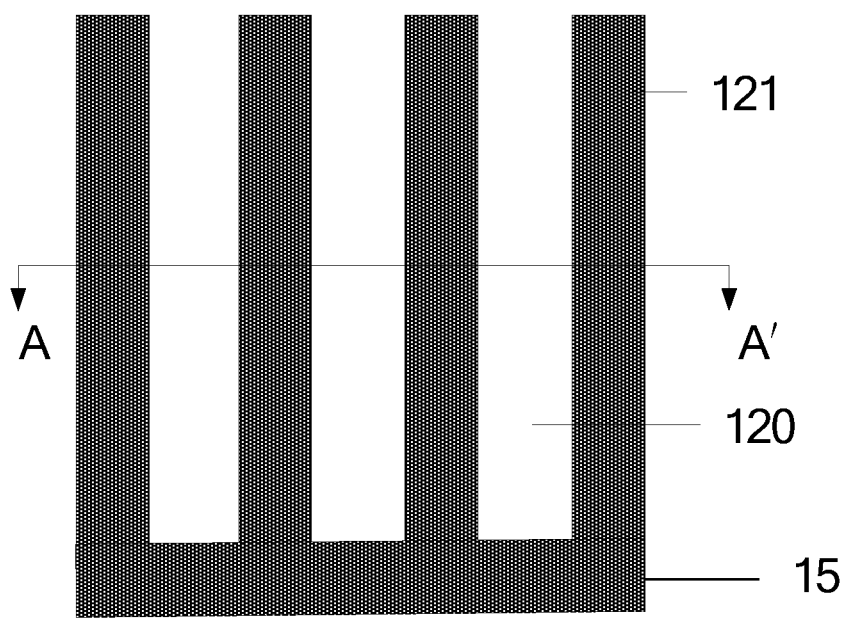
FIG. 3b is a schematic view of connecting lines provided at one side of a first conductive strip in the static-electricity shield layer of the in-cell touch display screen provided by an embodiment of the invention

For example, the plurality of first conductive strips may be electrically connected by a first connecting line 15 disposed at a side of the first conductive strips. As shown in FIG. 3, the plurality of first conductive strips are respectively connected with the first connecting line 15. The connecting line may be connected to the ground or to a capacitor or the like, so that the first conductive strips can act to prevent interference of external static-electricity or electromagnetic waves. The first connecting line may be disposed in the same layer as the first conductive strips, or the plurality of first conductive strips may be connected by another manner, which is not specifically limited in the invention.

For example, the first conductive strips correspond to the first touch electrodes one by one. That is, one first conductive strip is disposed at the position corresponding to each of the first conductive strips.

Figure 4:
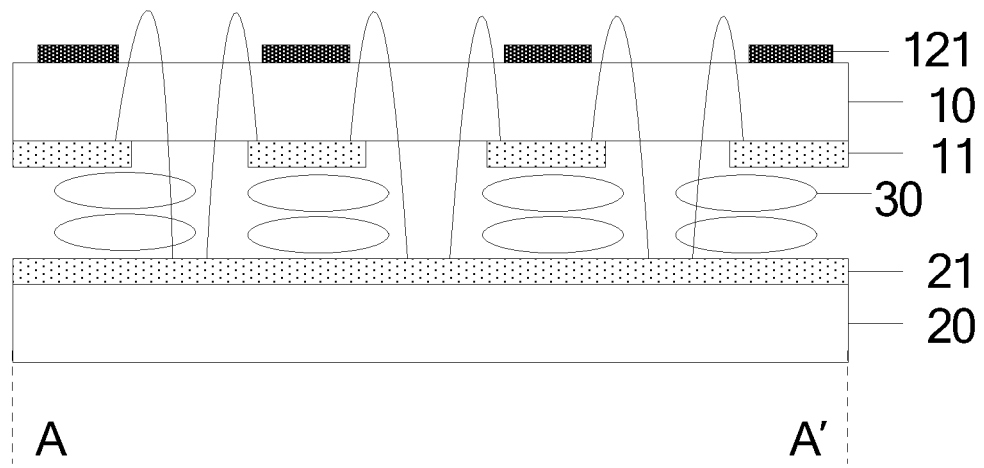
FIG. 4 is a schematic view of another in-cell touch display screen provided by an embodiment of the invention.
Figure 5:
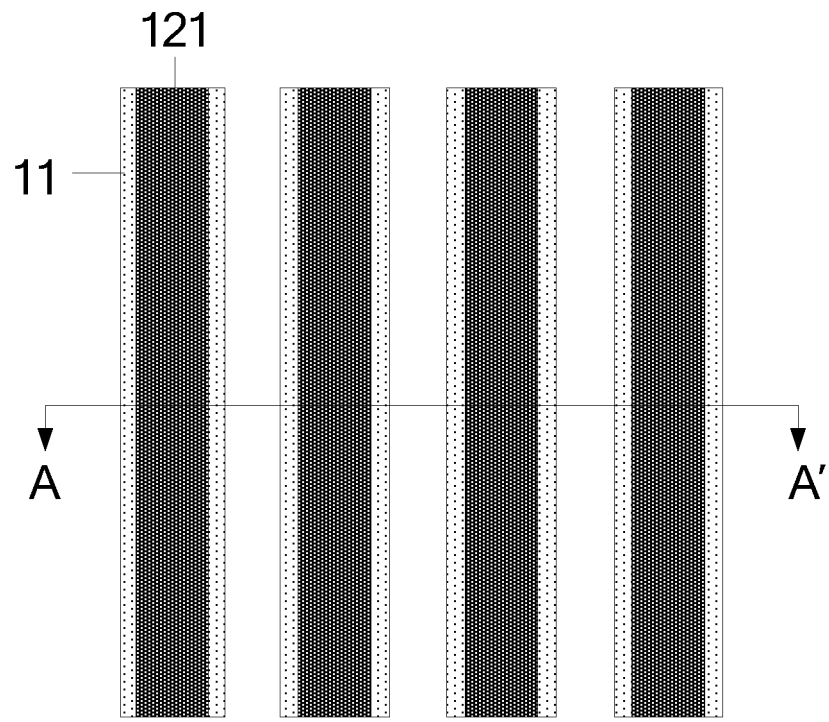
FIG. 5 is an orthographic projection view of the static-electricity shield layer and a first touch electrode in the in-cell touch display screen illustrated in FIG. 4.

For example, as shown in FIG. 4 and FIG. 5, the widths of the first conductive strips 121 are less than the widths of the first touch electrodes 11. An orthographic projection of a first conductive strip 121 on a first touch electrode 11 is located within the area of the first touch electrode 11. That is, the first conductive strip 121 covers a part of the first touch electrode 11 correspondingly. It is helpful for the first touch electrodes and the second electrodes to sense touch information in the case where the orthographic projection of the first conductive strip is located within the areas of the first touch electrodes instead of the gap between the first touch electrodes.

Because a first conductive strip covers a part of the corresponding first touch electrode, the first conductive strip can shield the touch signals. For example, the width of the first conductive strip is configured to be less than the width of the first touch electrode, which helps to sense the touch information. A side of the first conductive strip is aligned with the first touch electrode to realize that the width of the first conductive strip is configured to be less than the width of the first touch electrode. As shown in FIG. 4 and FIG. 5, both sides of the first touch electrode 11 are beyond the orthographic projection, on the first touch electrode, of the first conductive strip 121. Because the first touch electrode and the second touch electrode mainly sense the touch signals by edges of the first touch electrode and the second touch electrode, when the both sides of the first touch electrode are beyond the first conductive strip and touch signals are generated at the both sides of the first touch electrode, the touch information can be favorably sensed.

Figure 6:
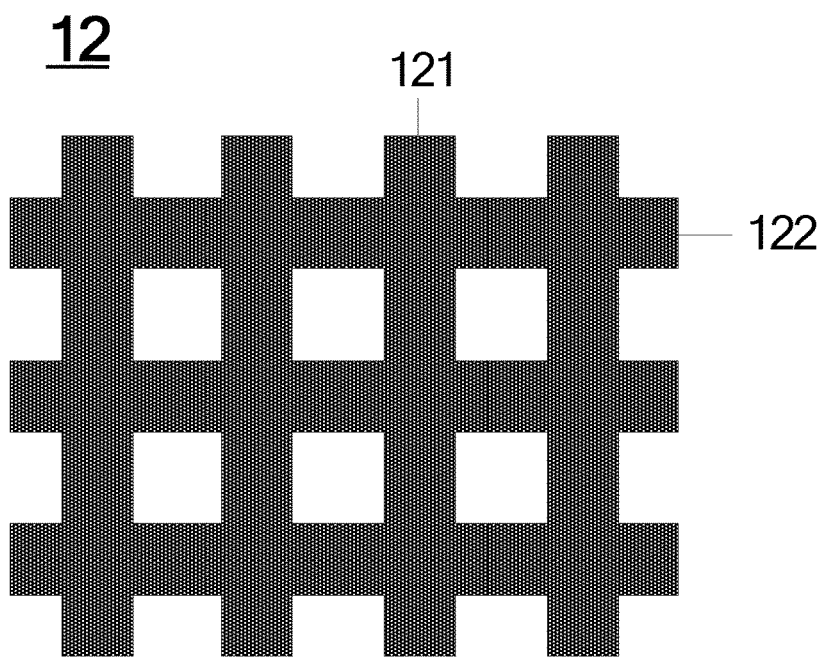
FIG. 6a is a schematic view of another static-electricity shield layer provided by an embodiment of the invention.
FIG. 6b is a schematic view of connecting lines provided at one sides of both a first conductive strip and a second conductive strip in the static-electricity shield layer provided by an embodiment of the invention.

For example, as shown in FIG. 6a, the static-electricity shield layer 12 includes a plurality of first conductive strips 121 electrically connected and a plurality of second conductive strips 122 electrically connected. Positions of the second conductive strip 122 correspond to positions of the first conductive strip 121. The configuration in which the first conductive strips 121 are perpendicular to the second conductive strips 122 is illustrated in FIG. 6a as an example. Furthermore, the second conductive strips correspond to the second touch electrodes one by one. That is, one second conductive strip is disposed at the position corresponding to each of the second conductive strips. The hollowed-out areas are the areas apart from the first conductive strips and the second conductive strips in the static-electricity shield layer and corresponding to the image display areas.

Figure 6B:
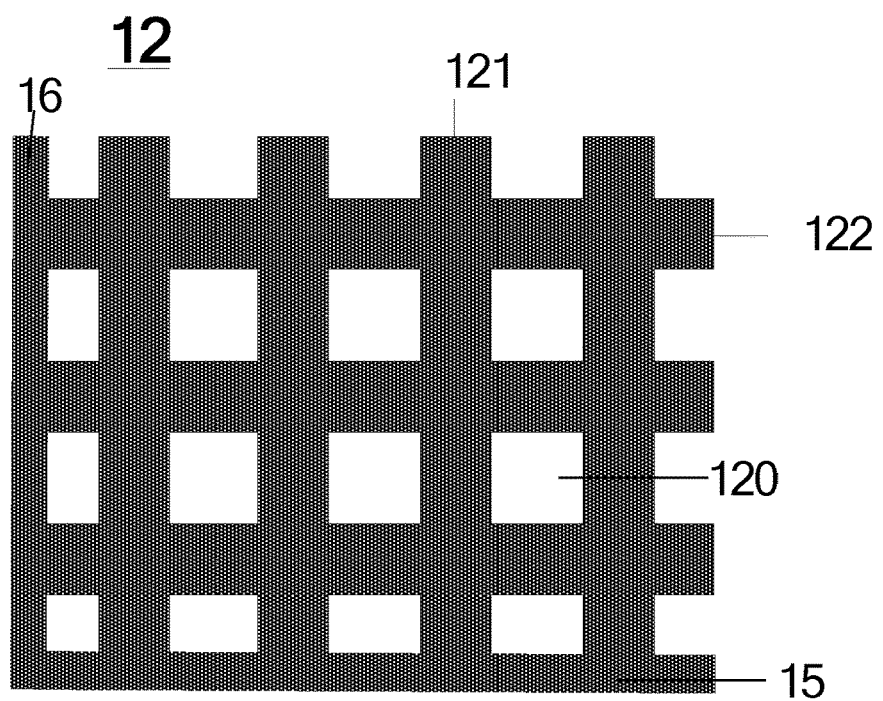

For example, as shown in FIG. 6b, the plurality of first conductive strips may be electrically connected by a first connecting line 15 disposed at a side of the first conductive strips, and the plurality of second conductive strips may be electrically connected by a second connecting line 16 disposed at a side of the second conductive strips. The plurality of first conductive strips are respectively connected with the first connecting lines 15, and the plurality of second conductive strips are respectively connected with the second connecting lines 16. The first connecting line and the second connecting line may be connected with each other or not. The first connecting line and the second connecting line may be connected to the ground or to a capacitor or the like, so that the first conductive strip and the second conductive strip can prevent interference of external static-electricity or electromagnetic waves. The first connecting line may be disposed in the same layer as the first conductive strip, and the second connecting line may be disposed in the same layer as the second conductive strip. When the first conductive strips are disposed in the same layer as the second conductive strips, the first conductive strips, the second conductive strips, the first connecting line and the second connecting line may be all disposed in the same layer. The plurality of first conductive strips, as well as the plurality of second conductive strips may be connected in another manner, which is not specifically limited in the invention.

For example, the first conductive strips and the second conductive strips are disposed in the same layer. That is, the first conductive strips and the second conductive strips may be formed of the same film by one patterning process. Because the second conductive strips corresponds to positions of the second touch electrodes and the first conductive strips corresponds to positions of the first touch electrodes, the first conductive strips and the second conductive strips intercross with each other, and the first conductive strips and the second conductive strips are electrically connected, the first conductive strips and the second conductive strips are connected to the ground or a capacitor, the first conductive strips and the second conductive strips together prevent interference of external static-electricity and electromagnetic waves.

Figure 7:
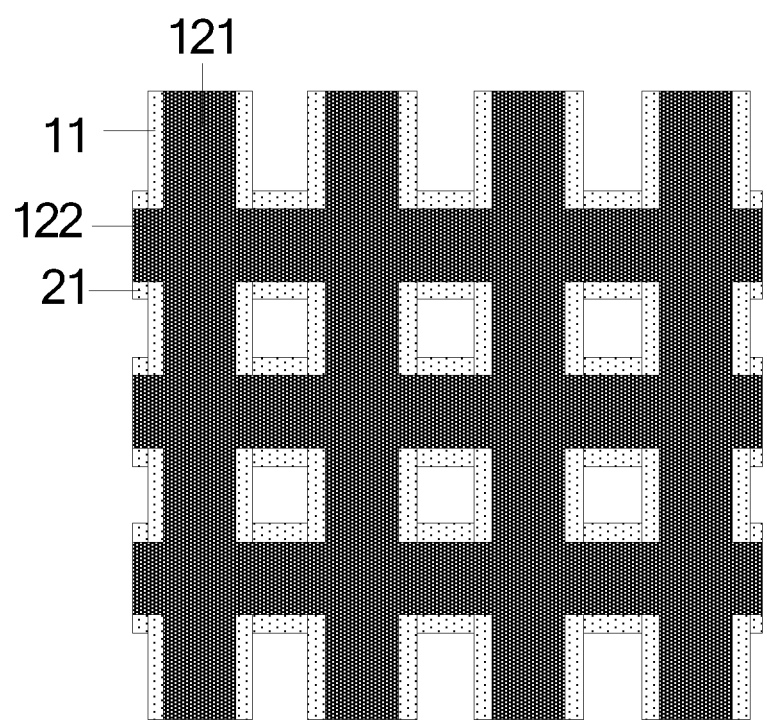

For example, as shown in FIG. 7, the width of a second conductive strip 121 is less than the width of a second touch electrode 21. An orthographic projection, on the second touch electrode 21, of the second conductive strip 122 is located within the area of the second touch electrode 21. That is, the second conductive strip 122 covers a part of the corresponding second touch electrode 21. It is helpful for the second electrodes to sense touch information when the orthographic projection of the second conductive strips is located within the areas of the second touch electrodes instead of the gap between the second touch electrodes.

Because a second conductive strip 122 covers a part of the corresponding second touch electrode 21, the second conductive strip can shield the touch signals. For example, the width of the second conductive strip is configured to be less than the width of the second touch electrode, as similar to the case in which the width of the first conductive strip is less than the width of the first touch electrode. It helps to sense the touch information. As shown in FIG. 7, for example, the second touch electrode 21 is beyond both sides of the orthographic projection, on the second touch electrode 21, of the second conductive strip 122. Because the first touch electrode and the second touch electrode mainly sense the touch signals by edges of the first touch electrode and the second touch electrode, it is helpful for the first touch electrodes to sense the touch information when the both sides of the second conductive strips are beyond the second conductive strips and the touched signals are generated in gaps between sides of the second touch electrodes.

On the other hand, the static-electricity shield layer includes conductive strips corresponding to the touch electrodes, and therefore compared with the static-electricity shield layer as illustrated in FIG. 2, the area of the conductive strips become smaller; the conductive strips correspond to the positions of the touch electrodes, which can avoid generating the static-electricity shield layer in other areas, deceasing transmittance of the display device An embodiment of the invention further provides a display device, comprising any of the above in-cell touch display screen provided by embodiments of the invention.

For example, the display device may be display means, such as a liquid crystal display, e-paper, an OLED (Organic Light-Emitting Diode) display, and the like, or the display device may be a TV, a digital camera, a mobile phone, a watch, a laptop, a navigator or any product or equipment that includes the display means and having a display function.

Embodiments of the invention provide an in-cell touch display screen and a display device. A static-electricity shield layer is disposed on a light emitting side of the upper substrate of the in-cell touch display screen. The static-electricity shield layer comprises a plurality of hollowed-out areas corresponding to the image display area, and prevents interference of external static-electricity and electromagnetic waves. The static-electricity shield layer comprises areas that do not cover the substrate, preventing the static-electricity shield layer from shielding touch signals of the first touch electrodes and the second touch electrodes. That is, the static-electricity shield layer prevents interference of external static-electricity and electromagnetic waves on one hand, while ensures the sensitivity of touch sensing to avoid malfunction of touching on the other hand.

Unless otherwise defined, all the technical and scientific terms used herein have the same meanings as commonly understood by one of ordinary skill in the art to which the present invention belongs. The terms "first," "second," etc., which are used in the description and the claims of the present application for invention, are not intended to indicate any sequence, amount or importance, but distinguish various components. Also, the terms such as "a," "an," etc., are not intended to limit the amount, but indicate the existence of at least one. The terms "comprise," "comprising," "include," "including," etc., are intended to specify that the elements or the objects stated before these terms encompass the elements or the objects and equivalents thereof listed after these terms, but do not preclude the other elements or objects. The phrases "connect", "connected", etc., are not intended to define a physical connection or mechanical connection, but may include an electrical connection, directly or indirectly. "On," "under," "right," "left" or the like are only used to indicate relative position relationship, and when the position of the object which is described is changed, the relative position relationship may be changed accordingly.

The above description is merely about embodiments of the invention, and does not restrict the scope of the invention. Any alternation or replacement that occurs to those skilled in the art within the technical scope disclosed by the invention should fall within the scope of the invention. Thus, the scope of the invention should be defined by accompanying claims.

The application claims priority of Chinese Patent Application No. 201410818510.X filed on Dec. 24, 2014, the disclosure of which is incorporated herein by reference in its entirety as part of the present application

The invention claimed is:

1. An in-cell touch display screen, comprising:
    an upper substrate and a lower substrate that are cell-assembled,
    a plurality of first touch electrodes and a plurality of second touch electrodes that are disposed on the upper substrate and/or the lower substrate without contacting each other,
    an image display area, and
    a static-electricity shield layer disposed on a light emitting side of the upper substrate,
    wherein the plurality of first touch electrodes are disposed on a light incident side of the upper substrate,
    the light emitting side and the light incident side are two opposite sides of the upper substrate respectively,
    the static-electricity shield layer comprises a plurality of hollowed-out areas corresponding to the image display area,
    the static-electricity shield layer comprises a plurality of first conductive strips that are electrically connected, and positions of the first conductive strips correspond to positions of the first touch electrodes, and
    widths of the first conductive strips are less than widths of the first touch electrodes, and an orthographic projection, on the first touch electrodes, of the first conductive strips is located within an area of the first touch electrodes.

2. The in-cell touch display screen according to claim 1, wherein the first conductive strips correspond to the first touch electrodes one by one.

3. The in-cell touch display screen according to claim 1, wherein the first touch electrodes are beyond both sides of the orthographic projection, on the first touch electrodes, of the first conductive strips.

4. The in-cell touch display screen according to claim 1, wherein the plurality of first conductive strips are electrically connected by a first connecting line that is disposed at a side of the first conductive strips.

5. The in-cell touch display screen according to claim 1, wherein the static-electricity shield layer comprises a plurality of second conductive strips that are electrically connected, and positions of the plurality of second conductive strips correspond to positions of the second touch electrodes.

6. The in-cell touch display screen according to claim 5, wherein the second conductive strips correspond to the second touch electrodes one by one.

7. The in-cell touch display screen according to claim 6, wherein the first conductive strips and the second conductive strips are disposed in a same layer.

8. The in-cell touch display screen according to claim 5, wherein widths of the second conductive strips are less than widths of the second touch electrodes, and an orthographic projection, on the second touch electrodes, of the second conductive strips is located within an area of the second touch electrodes.

9. The in-cell touch display screen according to claim 8, wherein the second touch electrodes are beyond both sides of the orthographic projection, on the second touch electrodes, of the second conductive strips.

10. The in-cell touch display screen according to claim 5, wherein the plurality of first conductive strips are electrically connected by a first connecting line disposed at a side of the first conductive strips, and the plurality of second conductive strips are electrically connected by a second connecting line disposed at a side of the second conductive strips.

11. The in-cell touch display screen according to claim 5, wherein the first conductive strips and the second conductive strips are disposed in a same layer.

12. The in-cell touch display screen according to claim 1, wherein the first touch electrodes are touch sensing electrodes, the second touch electrodes are touch driving electrodes, and the first touch electrodes are disposed above the second touch electrodes.

13. The in-cell touch display screen according to claim 12, wherein the first touch electrodes are disposed on the upper substrate, and the second touch electrodes are disposed on the lower substrate.

14. A display device, comprising the in-cell touch display screen according to claim 1.

* * * * *